United States Patent [19]

Beck, deceased et al.

[11] 4,255,849

[45] Mar. 17, 1981

[54] METHOD FOR CONSTRUCTING A SUPERCONDUCTING MAGNET WINDING

[75] Inventors: Kurt Beck, deceased, late of Erlangen, Fed. Rep. of Germany; by Christa Beck, heir, Erlangen, Fed. Rep. of Germany; by Thomas Beck, heir, Erlangen, Fed. Rep. of Germany; by Matthias Beck, heir, Erlangen, Fed. Rep. of Germany; Helmut Marsing, Neunkirchen, Fed. Rep. of Germany

[73] Assignee: Siemens Aktiengesellschaft, Munich, Fed. Rep. of Germany

[21] Appl. No.: 960,821

[22] Filed: Nov. 15, 1978

[30] Foreign Application Priority Data

Nov. 28, 1977 [DE] Fed. Rep. of Germany ....... 2753055

[51] Int. Cl.³ ....................... H01L 39/24; H01F 41/04

[52] U.S. Cl. ....................................... 29/599; 29/605; 336/96

[58] Field of Search .................... 29/599, 605; 336/55, 336/60, 185, DIG. 1, 96

[56] References Cited

U.S. PATENT DOCUMENTS

| | | | |
|---|---|---|---|
| 2,942,214 | 6/1960 | Fruengel | 336/96 |
| 3,333,331 | 8/1976 | Swartz | 29/599 |
| 3,368,174 | 2/1968 | Fischer | 336/60 |
| 3,514,730 | 5/1970 | Kassner | 336/60 |

FOREIGN PATENT DOCUMENTS

| | | | |
|---|---|---|---|
| 2459104 | 6/1976 | Fed. Rep. of Germany | 29/599 |

*Primary Examiner*—Lowell A. Larson
*Attorney, Agent, or Firm*—Kenyon & Kenyon

[57] ABSTRACT

A method for constructing a superconducting magnet winding which contains parallel winding layers each spaced by a separator and around the outer surface of which hardenable material is cast which is worked to a predetermined dimension after hardening, in which each winding layer is prefabricated individually and its outer surface is provided with a cast, ridge-like extension of hardenable material, and in which all cast extensions are worked down to the fit dimension after the winding is assembled, avoiding cementing of cooling ducts together in the separators.

11 Claims, 3 Drawing Figures

METHOD FOR CONSTRUCTING A SUPERCONDUCTING MAGNET WINDING

BACKGROUND OF THE INVENTION

This invention relates to superconducting magnet windings in general and more particularly to an improved method for constructing a superconducting magnet winding.

Superconducting magnet windings which contain several winding layers arranged parallel to each other, between each of which a separator of insulating material, forming cooling ducts, is inserted, and which is surrounded, at least over parts of its outer surface, by a hardenable material which is worked down to a predetermined dimension after the hardening process are known.

Magnet windings with superconductors can advantageously be used for producing magnetic fields of large volume. If the superconductors of these windings are cooled down to a temperature below the so-called transition temperature of the superconductive material used for the winding by means of a coolant, generally by means of liquid helium, the ohmic resistance of the superconductive material disappears almost completely. Because of the correspondingly reduced power required, superconducting magnets therefore offer the advantage, over conventional magnets with windings of electrically normally conducting material such as copper, that stronger magnetic fields and thus, also greater magnetic field gradients can be obtained thereby. Such magnet windings are needed, for instance, for fusion reactors, the strong magnetic fields of which are used to confine a hot plasma by means of magnetic forces and thereby to make a fusion process in the plasma possible.

A further field of application of such superconducting magnet windings are as support or lateral guidance magnets for a magnetic suspension system which allows contactless guidance of a vehicle along a stationary track according to the electrodynamic repulsion principle.

In addition, suitable superconducting windings can also be provided for the deflection or focusing of a beam of charged particles for instance, in particle accelerators.

In order to obtain very strong magnetic fields or large magnetic field gradients, the effective current densities in their superconducting conductors must generally be chosen very high. This may make loading of the superconductors up to near their critical current necessary. Such conductors must be protected, particularly from mechanical instabilities which can be caused by conductor movements. For, if a superconductor with a magnet winding has the possibility of moving under the action of an external force, for instance, due to a variable magnetic field, then it can heat up, due to the friction heat connected with such movement or due to the kinetic energy converted into heat, to such an extent that its transition temperature is exceeded and it becomes normally conducting, at least at the location of the mechanical instability.

In order to prevent such instabilities of the mechanical kind and the warming up of the conductors connected therewith, the individual layers of the winding of a superconducting magnet winding can be impregnated, in a known manner, with a material which is hardened and thereby bonds the winding layers firmly to each other. It must be ensured, however, that the superconductors of the winding are sufficiently well cooled by a cryogenic medium. The cooling ducts required therefor can be obtained, for instance, by installing separate inserts when the winding is made. These inserts correspond to the cooling ducts in the magnet winding; they can be removed from the winding after the impregnating process is completed, i.e., after the impregnating material has set British Pat. No. 1,443,207.

Since, in larger superconducting magnet windings, large current densities provided, correspondingly large forces which bulge out the winding also occur. These windings must frequently be exposed to a large mechanical pretension at their outer circumference. This is generally accomplished by means of special components such as wedges, screws or cup springs, which are fitted between an armor and the outer cylindrical surface of the winding. With these measures, unpermissible movements of the superconductors and, if necessary, also movements of the entire windings within a winding housing, which can likewise make the winding normally conducting, are prevented. A corresponding fixation of a winding in a winding housing is known, for instance, from the German Offenlegungsschrift No. 24 59 104, pages 4 to 6 and FIGS. 1 to 5.

With this known method of fabrication, the magnet winding, which contains several winding layers which are arranged parallel to each other and between each of which a separator is inserted, is first surrounded, at its outer, relatively irregularly shaped sidewall surface, with a hardenable material. After hardening, the material is then worked down to a predetermined dimension. Thereupon, the separators between adjacent winding layers, are replaced by corresponding insulating layers which contain cavities for conducting a coolant, and the individual parts of the winding are cemented together. The winding assembled in this manner can then be inserted into a housing and can be prestressed, at its outer surface which was worked down to the predetermined shape, using suitable intermediate elements such as wedges. This known method for constructing a winding, however, is relatively laborious.

SUMMARY OF THE INVENTION

It is therefore an object of the present invention to simplify this known method and, in particular, to avoid the later replacement of the separators by insulating layers forming cooling ducts.

According to the present invention, this problem is solved for a method of the kind mentioned at the outset by individually prefabricating every winding layer and providing a outer surface with a ridge shaped cast extension of hardenable material and, after the entire winding is assembled, working together the cast extensions of all winding layers down to the predetermined dimension.

The advantages of this method are, in particular, that the insulating separators with cavities for cooling ducts can be used for the construction of the winding from the start. This is possible because each individual winding layer is provided with ridge-like cast extensions and thus, clogging of cooling ducts, which can happen if the hardenable material is cast around the entire winding, is precluded from the start.

If two conductor layers, which are disposed on top of each other and are fastened to a separator foil, are used as the individual winding layers, then a separator foil extending beyond the outer surface of the respective winding layer can advantageously be used, according to a further embodiment of the invention. The material of the cast extension is then cast around the protruding part of this foil. Thus, the cast extension can be prevented from breaking off.

DETAILED DESCRIPTION OF THE INVENTION

Figure 1:
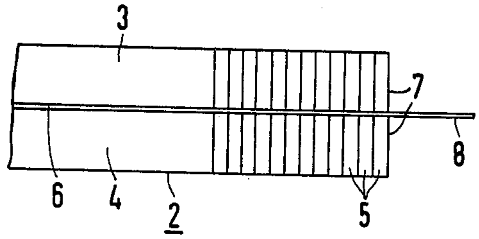
FIG. 1 is a diagrammatic cross-section of a winding layer according to the present invention.

In FIG. 1, part of a prefabricated winding layer 2 is illustrated diagrammatically in cross section. A superconducting magnet winding constructed in accordance with the present invention is to contain a multiplicity of such winding layers. For increasing the winding density of such a magnet winding, the winding layer 2 is advantageously designed as a so-called "double-pancake" winding layer. Such winding layers consist generally of two paralled conductor layers 3 and 4 of equal size, which are wound from ribbon shaped superconductors 5. The mutually insulated turns of the two conductor layers 3 and 4 are fastened (for instance, cemented) to an insulating separator foil 6 which is arranged between the two conductor layers. The fabrication of a corresponding double-pancake winding layer is known, for instance, from the German Offenlegungsschrift No. 25 57 527. The separator foil 6 between the two conductor layers 3 and 4 consists advantageously of fiberglass reinforced plastic material. It advantageously protrudes somewhat beyond the outer sidewall surface 7 of the winding layer 2. The protruding part of this foil 6 is designated as 8 in the figure.

Figure 2:
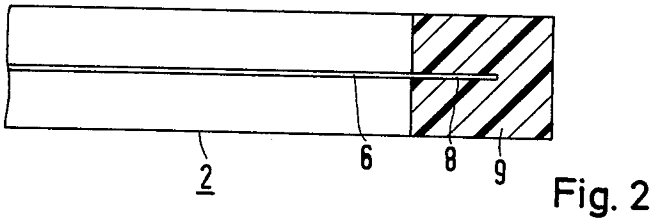
FIG. 2 is a similar view of the winding layer after having a cast extention placed thereon.

As shown by the cross section through a winding layer diagrammatically shown in FIG. 2, the outer surface 7 of each winding layer 2 is provided with a cast extension 9. The cast extensions consist of a hardenable casting resin, for instance, epoxy resin with an aluminum oxide filler. A simple fixture is used for casting and hardening of the resin in making these cast extensions. No particular accuracy is required for this operation. The protruding part 8 of the foil 6 extends into the respective cast extension 9 and thus acts as armor and for holding the cast extension. This facilitates the connection of the cast extension 9 at the circumference of the double-pancake winding layer 2 and prevents it from breaking away from the outer surface 7.

Figure 3:
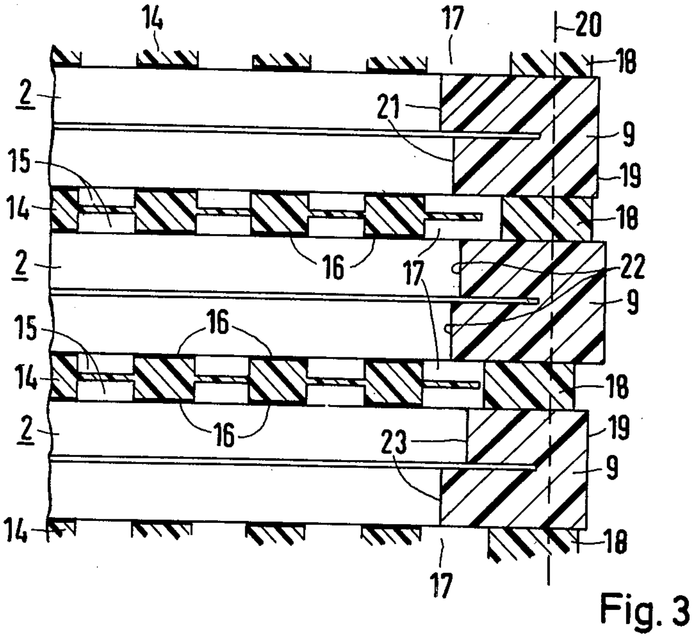
FIG. 3 is a cross-sectional view of a plurality of the winding layers of FIG. 2 assembled into windings with insulating spacers between winding layers.

According to FIG. 3, a magnet winding can now be assembled from a multiplicity of such winding layers with cast extensions. In the cross section of the figure, only three winding layers 2 are partially detailed diagrammatically. Adjacent winding layers are always spaced from each other by a separator of insulating material. Advantageously, cooling duct discs 14 of fiberglass reinforced plastic material are used as separators. In these cooling duct discs, recesses 15 are provided, through which a cryogenic medium required for cooling the superconductors 5 of the winding layers 2 can be conducted. The winding layers 2 and the cooling discs 14 are cemented together at cementing surfaces 16, which are indicated in the figure by bold lines. It is further advantageous to insert spacers, regularly distributed over the circumference, into the slot-like spaces 17 formed between the ridge-like cast extensions 9 of adjacent winding layers 2. Separators 18 of plastic material with a thickness corresponding to the thickness of the cooling duct discs 14 are used as spacers. They are advantageously inserted only some distance into the slot-like spaces 17 and can then be cemented to the adjacent cast extensions 9. In this manner, the cast on ridges form a stiff, mutually supporting assembly. As is illustrated in the figure, the outer surface 19 of this assembly generally does not represent a smooth surface but has a relatively irregular shape. However, this does not matter, since the winding thus assembled and cemented together is advantageously worked down to a predetermined dimension at its outer circumference. The separators 18 between the ridge-like cast extensions 9 prevent the latter from breaking away from the corresponding sidewall surfaces. A corresponding fitting surface, to which the winding is to be worked down, is indicated in the figure by a dashed line 20. Through this machining operation, the accurate countersurfaces necessary for a support fitting can be produced without difficulty. There is no danger that the numerous cooling ducts leading out of the winding to the outside in the cooling duct discs 14 could be adversely affected. Using the surface 20, the entire winding can then be pre-tensioned by means of suitable components such as wedges, not shown in the figure.

With relatively wide superconductors 5, which result in relatively large cast extension surfaces 7 at the outer sidewall surface of each winding layer 2, it is also possible (if indicated) to dispense with the separators 18 between the individual cast extensions 9.

In FIGS. 1 and 2 it is assumed that the outer cast extension surfaces of each conductor layer 3 and 4 lie on a common outer surface 7. With the method according to the present invention, this is not necessary, however. Rather, an irregular shape of the cast extension surfaces will generally be obtained in winding the individual conductor layers. This irregular shape is further illustrated in FIG. 3. It is further illustrated in this figure that the cast extension surfaces, designated as 21 to 23, of each of the winding layers 2 shown also need not lie approximately on a common outer surface. For, the resulting differences in size are advantageously compensated by correspondingly amply designed cast extensions 9, in the method according to the present invention.

What is claimed is:

1. A method for constructing a superconducting magnet winding which contains several winding layers which are arranged parallel to each other with a separator of insulating material forming cooling ducts inserted between each two layers, and which winding is surrounded, at least at parts of its outer surface, by hardenable material which is worked down to a predetermined dimension after the hardening process, comprising:

(a) individually prefabricating each winding layer with an outer surface having a ridge shaped cast extension of the hardenable material;

(b) assembling said winding layers with spacers therebetween into a magnet winding; and (c) working the cast extensions of all winding layers down to the predetermined dimension after the entire winding is assembled.

2. The method according to claim 1 and further including, before the assembled winding is worked down, inserting individual separators with a thickness which corresponds to the thickness of the corresponding spacer between adjacent cast extensions.

3. The method according to claim 2, wherein said individual separators are cemented between the cast extensions.

4. The method according to claim 1, wherein, before the cast extensions are worked down, the winding layers are cemented together with said spacers arranged between them.

5. The method according to claim 1 for constructing a superconducting magnet winding with winding layers, each of which consists of two parallel conductor layers fastened to a separator foil, comprising using a separator foil protruding beyond the respective winding layer.

6. The method according to claim 5, wherein said separator foil comprises fiberglass reinforced plastic material.

7. The method according to claim 5 wherein a hardenable casting resin is used as the material for the cast extensions.

8. The method according to claim 7, wherein said resin comprises epoxy resin with aluminum oxide filler.

9. The method according to claim 1 wherein a hardenable casting resin is used as the material for the cast extensions.

10. The method according to claim 9 wherein said resin comprises epoxy resin with aluminum oxide filler.

11. The method according to claim 1 wherein said spacers are cooling duct disks.

* * * * *